(12) United States Patent
Kim et al.

(10) Patent No.: US 10,600,791 B2
(45) Date of Patent: Mar. 24, 2020

(54) SEMICONDUCTOR MEMORY DEVICE

(71) Applicant: SAMSUNG ELECTRONICS CO., LTD., Suwon-si, Gyeonggi-do (KR)

(72) Inventors: Dong-Wan Kim, Hwaseong-si (KR); Keunnam Kim, Yongin-si (KR); Juik Lee, Anyang-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 16/125,167

(22) Filed: Sep. 7, 2018

(65) Prior Publication Data
US 2019/0206877 A1  Jul. 4, 2019

(30) Foreign Application Priority Data
Jan. 3, 2018 (KR) .................. 10-2018-0000764

(51) Int. Cl.
| | |
|---|---|
| H01L 27/108 | (2006.01) |
| H01L 27/22 | (2006.01) |
| G11C 8/08 | (2006.01) |
| H01L 23/535 | (2006.01) |
| H01L 27/24 | (2006.01) |
| G11C 8/14 | (2006.01) |

(52) U.S. Cl.
CPC .......... *H01L 27/10897* (2013.01); *G11C 8/08* (2013.01); *G11C 8/14* (2013.01); *H01L 23/535* (2013.01); *H01L 27/10885* (2013.01); *H01L 27/10888* (2013.01); *H01L 27/10891* (2013.01); *H01L 27/228* (2013.01); *H01L 27/2436* (2013.01)

(58) Field of Classification Search
None
See application file for complete search history.

(56) References Cited

U.S. PATENT DOCUMENTS

| | | | |
|---|---|---|---|
| 6,150,700 A | 11/2000 | Lee | |
| 7,755,131 B2 | 7/2010 | Kinoshita | |
| 9,076,864 B2 | 7/2015 | Lee et al. | |
| 2006/0077702 A1 | 4/2006 | Sugimae et al. | |
| 2015/0255466 A1* | 9/2015 | Hwang | H01L 21/02164 438/586 |
| 2015/0303200 A1 | 10/2015 | Yuki | |

FOREIGN PATENT DOCUMENTS

| | | |
|---|---|---|
| JP | 4864756 B2 | 2/2012 |
| KR | 10-1999-0065885 A | 8/1999 |
| KR | 10-0655343 B1 | 12/2006 |
| KR | 10-2010-0042886 A | 4/2010 |
| KR | 10-1022101 B1 | 3/2011 |
| KR | 10-2012-0126719 A | 11/2012 |
| KR | 10-2015-0089045 A | 8/2015 |

* cited by examiner

*Primary Examiner* — Sonya D. McCall-Shepard
(74) *Attorney, Agent, or Firm* — Lee IP Law, P.C.

(57) ABSTRACT

A semiconductor memory device includes a word line buried in an upper portion of a substrate and extending in a first direction, and a word line contact plug connected to the word line. An end portion of the word line includes a contact surface exposed in the first direction, and the word line contact plug is connected to the contact surface.

19 Claims, 15 Drawing Sheets

SEMICONDUCTOR MEMORY DEVICE

CROSS-REFERENCE TO RELATED APPLICATION

Korean Patent Application No. 10-2018-0000764, filed on Jan. 3, 2018, in the Korean Intellectual Property Office, and entitled: "Semiconductor Memory Device," is incorporated by reference herein in its entirety.

BACKGROUND

1. Field

Embodiments relate to a semiconductor memory device and a method of manufacturing the same.

2. Description of the Related Art

As semiconductor devices have become more highly integrated, widths of patterns included in semiconductor devices have been reduced. However, since new exposure techniques and/or expensive exposure techniques are needed to form fine patterns, new integration techniques are being studied.

SUMMARY

In an aspect, a semiconductor memory device may include a word line buried in an upper portion of a substrate and extending in a first direction, and a word line contact plug connected to the word line. An end portion of the word line may include a contact surface exposed in the first direction, and the word line contact plug may be connected to the contact surface.

In an aspect, a semiconductor memory device may include a substrate including a cell array region and a peripheral circuit region, word lines buried in an upper portion of the substrate and extending from the cell array region to the peripheral circuit region in a first direction, and word line contact plugs connected to end portions of the word lines. Each of the word line contact plugs may have a long axis in the first direction when viewed in a plan view, and a portion of each of the word line contact plugs may overlap with the end portion of the word line.

In an aspect, a semiconductor memory device may include a substrate including a cell array region and a peripheral circuit region, a word line buried in an upper portion of the substrate and extending from the cell array region to the peripheral circuit region in a first direction, a word line contact plug connected to an end portion of the word line, and a peripheral contact plug connected to an upper portion of the substrate of the peripheral circuit region. A top surface of the word line contact plug may be disposed at substantially the same level as a top surface of the peripheral contact plug.

BRIEF DESCRIPTION OF THE DRAWINGS

Features will become apparent to those of ordinary skill in the art by describing in detail exemplary embodiments with reference to the attached drawings in which.

DETAILED DESCRIPTION

Hereinafter, embodiments will be described in more detail with reference to the accompanying drawings.

Figure 1:
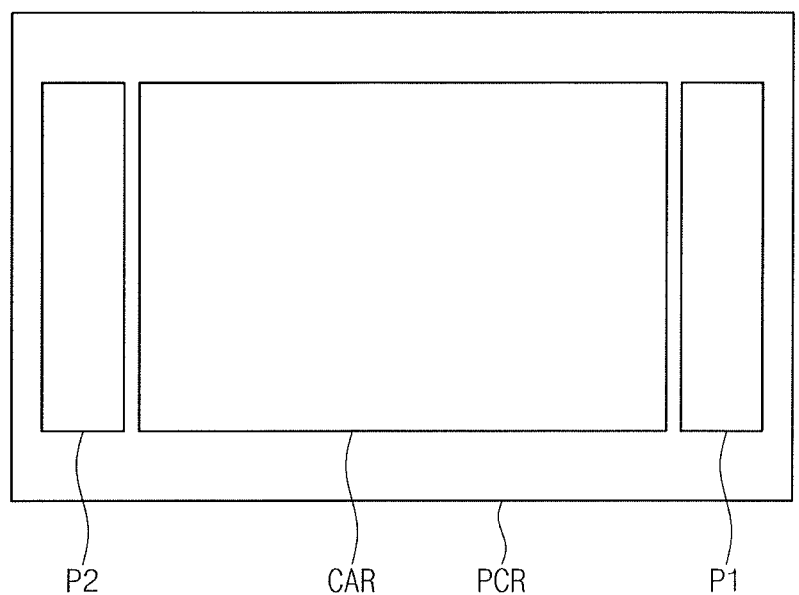
FIG. 1 illustrates a schematic block diagram of a semiconductor memory device according to some embodiments.
Figure 2:
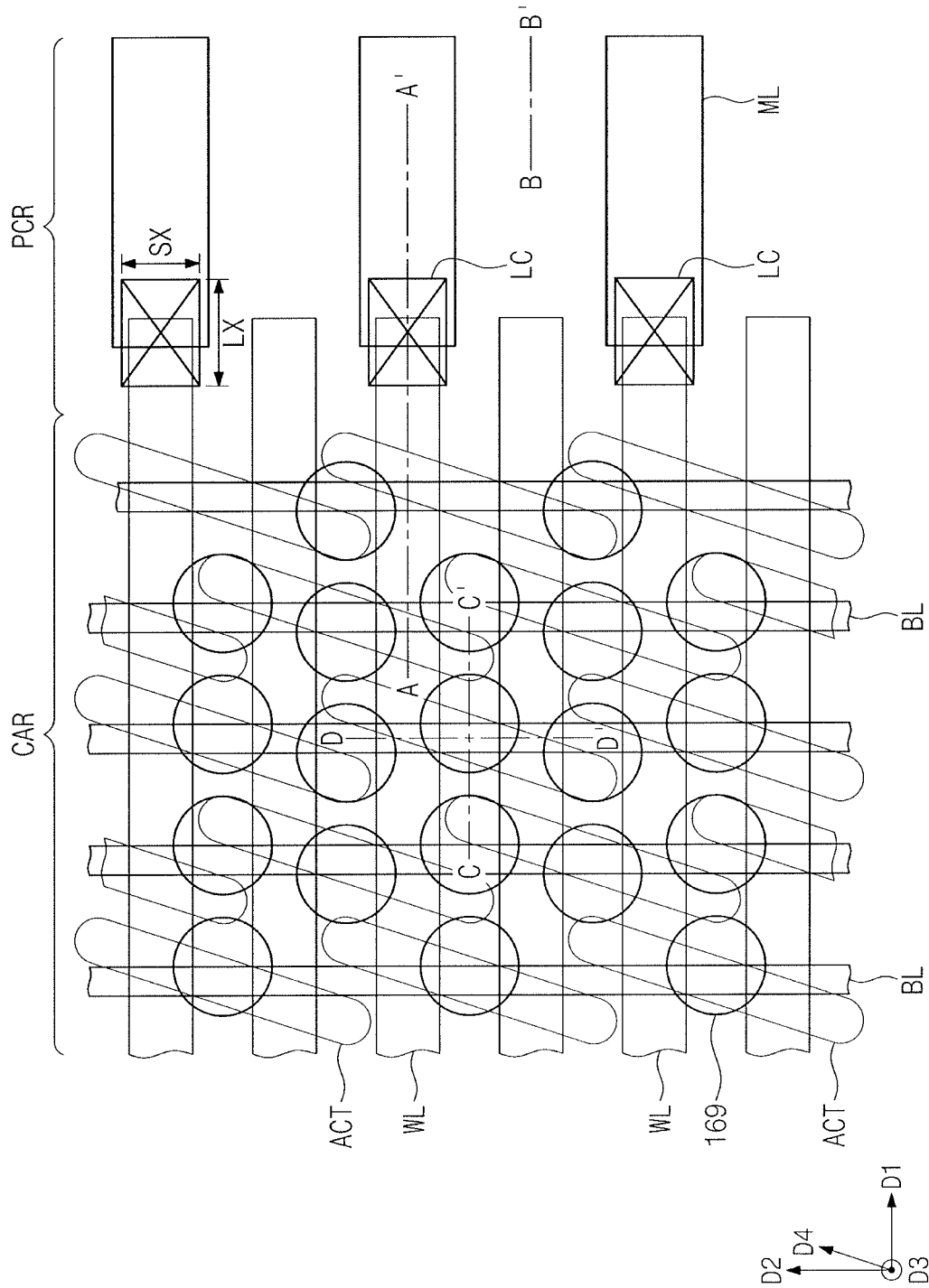
FIG. 2 illustrates a plan view of a semiconductor memory device according to some embodiments.
Figure 3A:
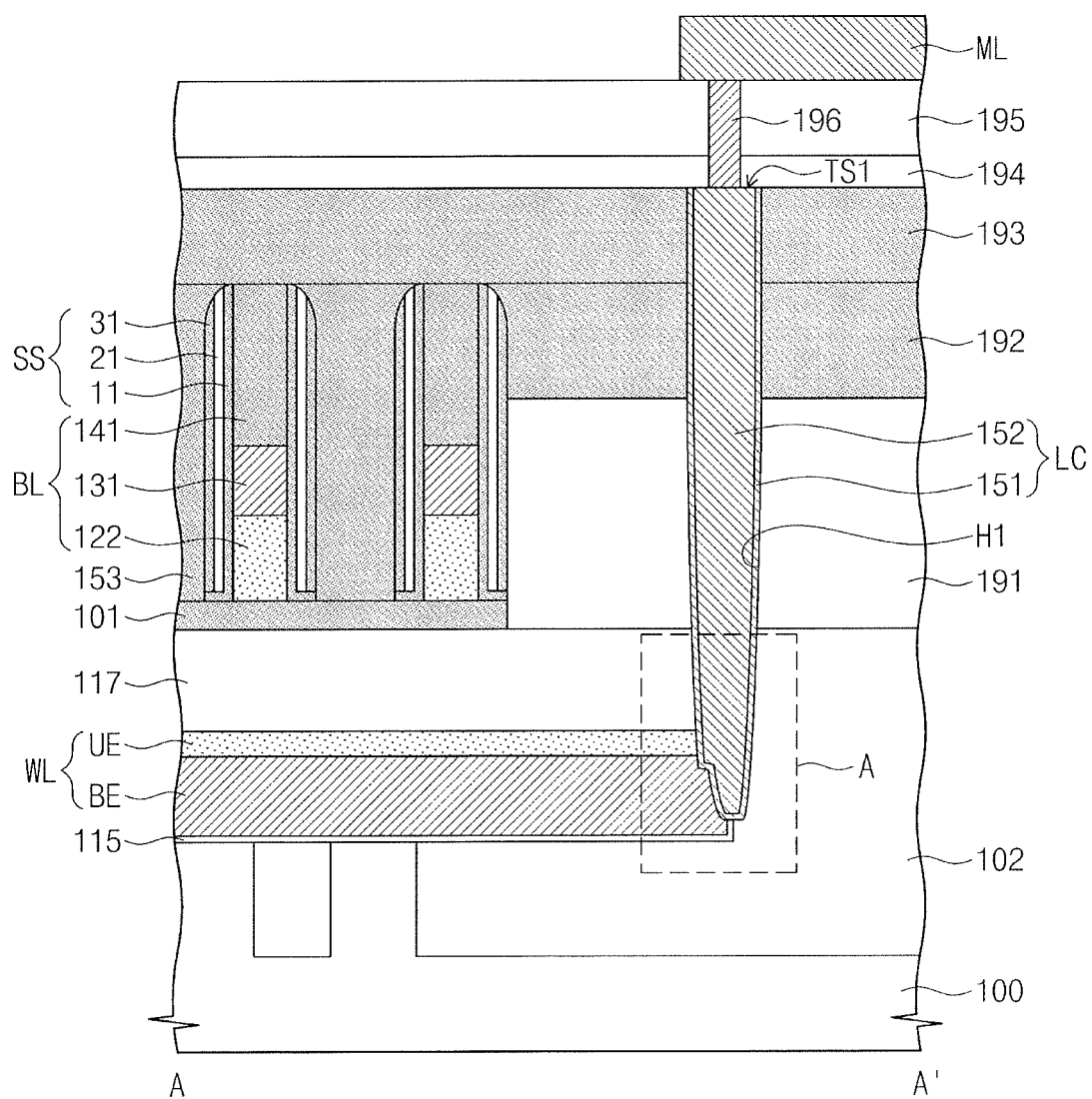
FIGS. 3A and 3B illustrate cross-sectional views taken along lines A-A' and B-B' of FIG. 2, respectively.
Figure 3B:
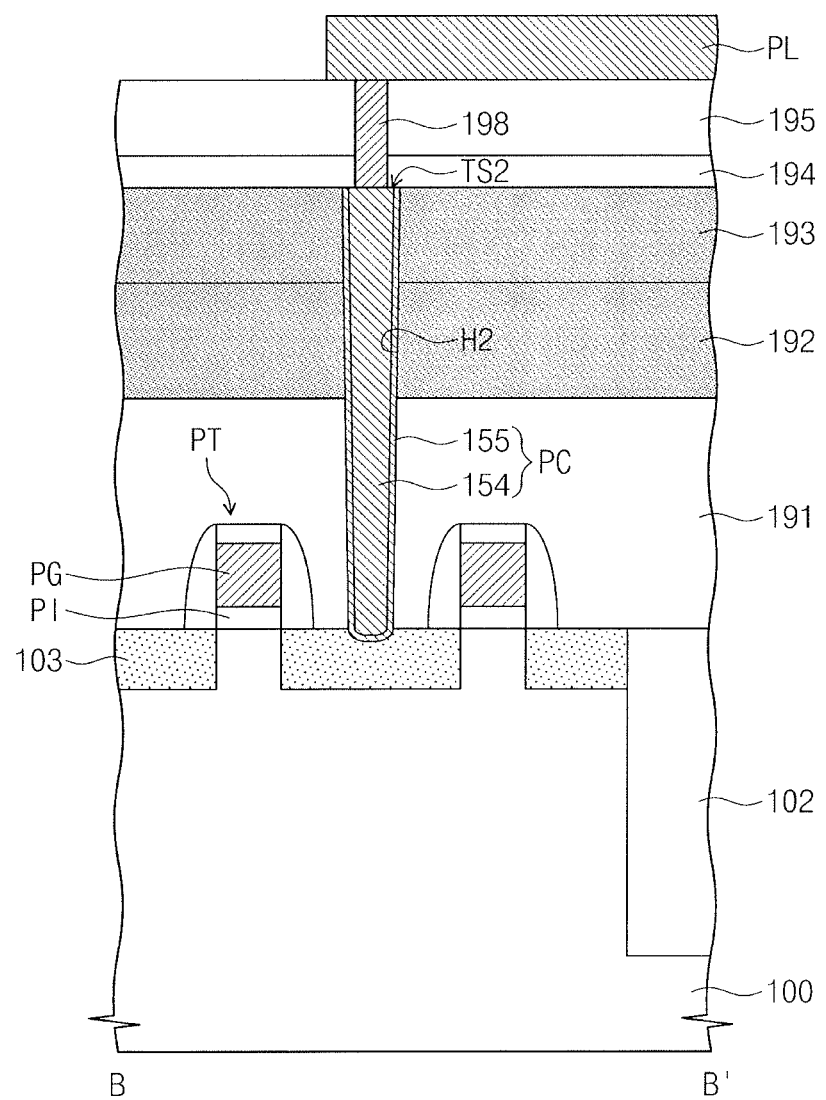
Figure 3C:
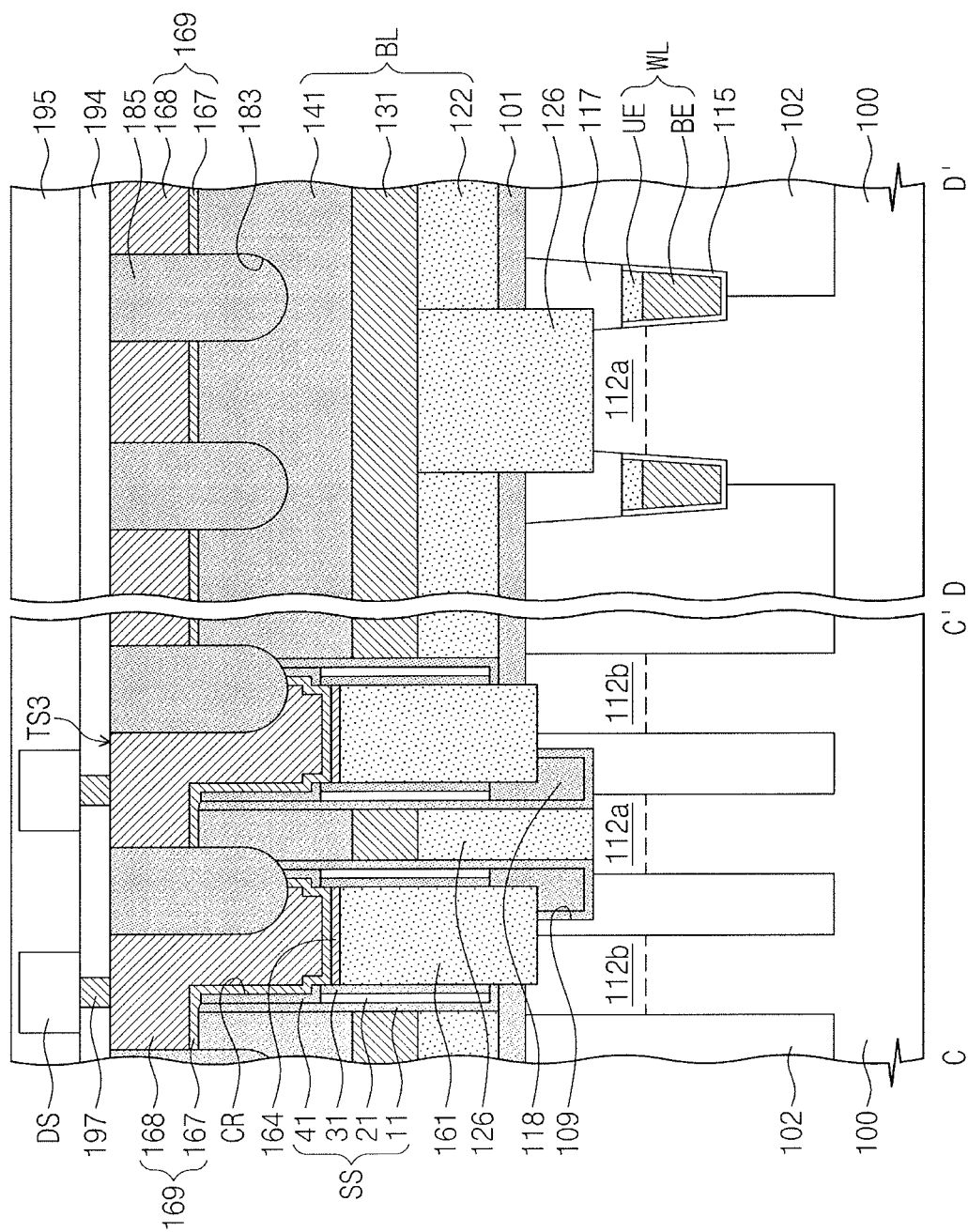
FIG. 3C illustrates a cross-sectional view taken along lines C-C' and D-D' of FIG. 2.
Figure 4:
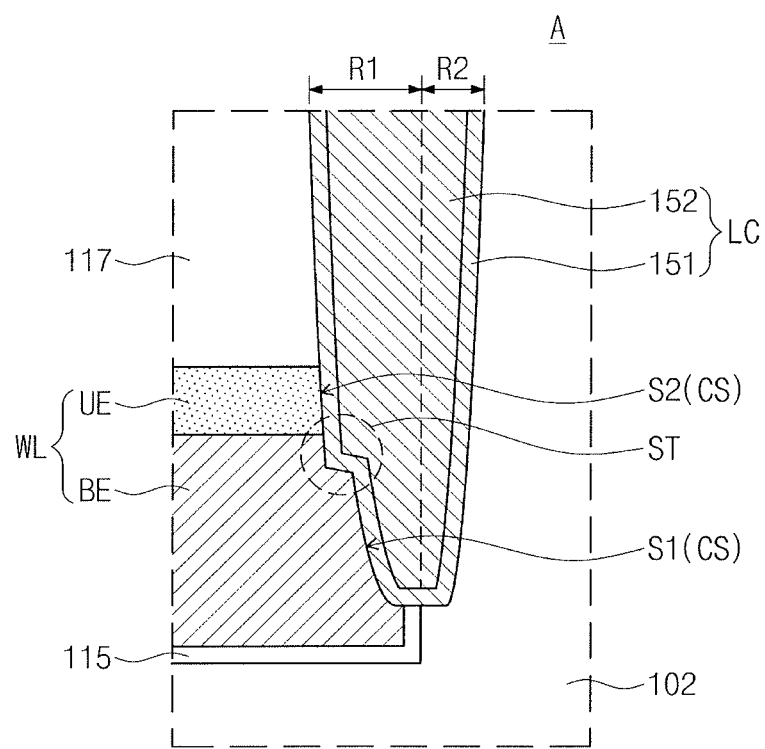
FIG. 4 illustrates an enlarged view of a region 'A' of FIG. 3A.

FIG. 1 is a schematic block diagram illustrating a semiconductor memory device according to some embodiments. FIG. 2 is a plan view illustrating a semiconductor memory device according to some embodiments. FIGS. 3A and 3B are cross-sectional views taken along lines A-A' and B-B' of FIG. 2, respectively, and FIG. 3C is a cross-sectional view taken along lines C-C' and D-D' of FIG. 2. FIG. 4 is an enlarged view of a region 'A' of FIG. 3A.

Referring to FIG. 1, a semiconductor memory device may include a cell array region CAR and a peripheral circuit region PCR for driving the cell array region CAR. The cell array region CAR may include memory cells. The peripheral circuit region PCR may be disposed around the cell array region CAR, e.g., around an entire periphery thereof. The peripheral circuit region PCR may include a word line driver, a sense amplifier, row and column decoders, and control circuits. For example, the peripheral circuit region PCR may include a first peripheral circuit region P1 and a second peripheral circuit region P2. The cell array region CAR may be between the first peripheral circuit region P1 and the second peripheral circuit region P2. For example, the word line drivers may be in the first and second peripheral circuit regions P1 and P2.

Referring to FIGS. 2 and 3A to 3C, a device isolation layer 102 may be in a substrate 100 to define active portions ACT. In a plan view, the substrate 100 may extend along a first direction D1 and a second direction D2 that intersect each other, e.g., are perpendicular. In a sectional view, the substrate 100 may extend along a third direction D3 that intersect the first direction D1 and second direction D2, e.g., is perpendicular thereto. Each of the active portions ACT may have a bar shape extending in a fourth direction D4, which intersects the first, second, and third directions D1 to D3, when viewed in a plan view.

Each of the active portions ACT may correspond to a portion of the substrate 100 surrounded by the device isolation layer 102 when viewed in a plan view. The substrate 100 may include a semiconductor material. For example, the substrate 100 may be a silicon substrate, a germanium substrate, or a silicon-germanium substrate. The device isolation layer 102 may include at least one of an oxide (e.g., silicon oxide), a nitride (e.g., silicon nitride), or an oxynitride (e.g., silicon oxynitride). The active portions ACT may be parallel to each other and may be arranged in adjacent pairs such that, in plan view, an end portion of each active portion ACT is adjacent to a central portion of another active portion ACT adjacent thereto. For example, a lower leftmost active portion ACT in a row is adjacent an active portion ACT in a next row up such that a first or upper end along the fourth direction D4 is adjacent a central portion of the active portion in the next row up, while a second or lower end along the fourth direction D4 of the active portion in the next row up is adjacent the active portion in the row.

Word lines WL may intersect the active portions ACT. The word lines WL may be buried in an upper portion of the substrate 100 and may extend in the first direction D1 parallel to a top surface of the substrate 100. The word lines WL may be formed of a conductive material, e.g., a metal, a conductive metal nitride, and/or a doped semiconductor. In some embodiments, each of the word lines WL may include a lower pattern BE and an upper pattern UE, which are formed of different materials from each other.

For example, the lower pattern BE may be a metal pattern which includes tungsten, titanium, tantalum, and/or any conductive nitride thereof. For example, the upper pattern UE may be a semiconductor pattern which includes poly-silicon doped with P-type or N-type dopants. A thickness of the lower pattern BE may be greater than a thickness of the upper pattern UE along the third direction D3. Each of the lower and upper patterns BE and UE may extend in the first direction D1.

A gate dielectric layer 115 may be between each of the word lines WL and the substrate 100. The gate dielectric layer 115 may include at least one of a silicon oxide layer, a silicon oxynitride layer, or a high-k dielectric layer.

Each of the active portions ACT may intersect a pair of the word lines WL. Each of the active portions ACT may include a first dopant region 112a between the pair of word lines WL intersecting each of the active portions ACT. Each of the active portions ACT may include second dopant regions 112b which are spaced apart from the first dopant region 112a with the pair of word lines WL interposed therebetween. For example, a pair of the second dopant regions 112b may be provided in both edge regions of each of the active portions ACT. The first and second dopant regions 112a and 112b may have a different conductivity type from that of the substrate 100. The first and second dopant regions 112a and 112b may be doped with N-type dopants. The word line WL and the first and second dopant regions 112a and 112b adjacent thereto may constitute a transistor.

Top surfaces of the word lines WL may be lower than top surfaces of the active portions ACT along the third direction D3. Word line capping patterns 117 may be disposed on the word lines WL, respectively. The word line capping patterns 117 may have line shapes extending along the word lines WL in the first direction D1. For example, the word line capping patterns 117 may include at least one of silicon oxide, silicon nitride, or silicon oxynitride.

Bit line structures BL may be disposed on the substrate 100. The bit line structures BL may extend in the second direction D2. Each of the bit line structures BL may include a first conductive pattern 122, a second conductive pattern 131, and a mask pattern 141. The first conductive pattern 122, the second conductive pattern 131, and the mask pattern 141 may extend in the second direction D2.

The first conductive pattern 122 may include a semiconductor material. For example, the first conductive pattern 122 may include doped poly-silicon. The second conductive pattern 131 may include at least one of a metal (e.g., tungsten, titanium, or tantalum) or a conductive metal nitride (e.g., titanium nitride, tantalum nitride, or tungsten nitride). A barrier pattern may be provided between the first conductive pattern 122 and the second conductive pattern 131. For example, the barrier pattern may include a metal-silicon compound, e.g., a silicide of tungsten, and/or a conductive metal nitride, e.g., tungsten nitride. The mask pattern 141 may include at least one of a nitride (e.g., silicon nitride) or an oxynitride (e.g., silicon oxynitride).

A lower insulating pattern 101 may be between the substrate 100 and the bit line structures BL. For example, the lower insulating pattern 101 may include at least one of silicon oxide, silicon nitride, or silicon oxynitride. In some embodiments, the lower insulating pattern 101 may include segments spaced apart from each other in a plan view.

First contact plugs 126 may connect the bit line structures BL to the first dopant regions 112a. The first contact plugs 126 may be provided at crossing points of the bit line structures BL and the first dopant regions 112a when viewed in a plan view. The first contact plug 126 may penetrate the first conductive pattern 122 along the third direction D3 so as to be connected to the second conductive pattern 131 of the bit line structures BL, as illustrated in FIG. 3C. The first contact plug 126 may penetrate the lower insulating pattern 101. The first contact plugs 126 may include a doped semiconductor material, e.g., doped poly-silicon.

Fence insulating patterns 153 may extend in the first direction D1 intersecting the bit line structures BL and may fill parts of spaces between the bit line structures BL. For example, the fence insulating patterns 153 may include silicon nitride and/or silicon oxynitride. Sidewalls of the fence insulating patterns 153 and sidewalls of the bit line structures BL may define contact regions CR. The fence insulating patterns 153 may be provided between the bit line structures BL.

Second contact plugs 161 may be provided in the contact regions CR. The second contact plugs 161 may be connected to the second dopant regions 112b, respectively. Top surfaces of the second contact plugs 161 may be higher than top surfaces of the second conductive patterns 131 of the bit lines structures BL. The second contact plugs 161 may include a doped semiconductor material, e.g., doped poly-silicon.

Connection pads 169 may be provided on the second contact plugs 161. The connection pads 169 may be on the second contact plugs 161, respectively. Lower portions of the connection pads 169 may fill upper regions of the contact regions CR. Upper portions of the connection pads 169 may extend onto the bit line structures BL, e.g., may be in direct contact with an upper surface of the bit line structures BL. Each of the connection pads 169 may include a barrier layer 167 and a metal layer 168. For example, the barrier layer 167 may include a conductive metal nitride, e.g., titanium nitride, tantalum nitride, or tungsten nitride. For example, the metal layer 168 may include at least one of titanium, tungsten, or tantalum. The connection pads 169 may be spaced apart, e.g., separated, along the first direction D1 from each other by an isolation insulating layer 185 extending along the third direction D3 provided in an isolation region 183. For example, the isolation insulating layer 185 may include at least one of silicon oxide, silicon nitride, or silicon oxynitride.

An ohmic layer 164 may be provided between the second contact plug 161 and the connection pad 169, which are connected to each other, along the third direction D3. The ohmic layer 164 may include a metal silicide such as tungsten silicide, titanium silicide, or tantalum silicide.

Spacer structures SS may be provided on both sidewalls of each of the bit line structures BL. Each of the spacer structures SS may include a first spacer 11, a second spacer 21, and a third spacer 31, sequentially stacked along the first direction the sidewall of the bit line structure BL. The first spacer may extend along the first direction D1 under bottom surfaces of the second spacer 21 and the third spacer 31. According to some embodiments, each of the spacer structures SS may further include a fourth spacer 41 covering top surfaces of the second and third spacers 21 and 31 along the first direction D1 (see FIG. 3C). The first spacer 11 and the fourth spacer 41 may extend along the third direction to have top surfaces thereof at a same height.

The spacer structures SS may extend in the second direction D2 along the bit line structures BL. In some embodiments, the first spacer 11 may conformally extend along a sidewall and a bottom surface of an opening 109 formed in an upper portion of the substrate 100. A gap-fill insulating layer 118 may be provided to fill the opening 109. For example, the gap-fill insulating layer 118 may include at least one of silicon oxide, silicon nitride, or silicon oxynitride.

The third spacer 31 may be formed of the same material as the first spacer 11. For example, the first and third spacers 11 and 31 may include at least one of silicon nitride or silicon oxynitride. The second spacer 21 may be provided between the first spacer 11 and the third spacer 31 along the first direction D1. For example, the second spacer 21 may include silicon oxide. In certain embodiments, the second spacer 21 may include a void therein. The fourth spacer 41 may be formed of the same material as the first and third spacers 11 and 31.

Data storage elements DS may be provided on the connection pads 169. Each of the data storage elements DS may be electrically connected to each of the connection pads 169 through a first upper contact 197 penetrating a fourth interlayer insulating layer 194. Each of the data storage elements DS may be electrically connected to a corresponding one of the second dopant regions 112b through a corresponding one of the connection pads 169 and a corresponding one of the second contact plugs 161. In some embodiments, the data storage element DS may be a capacitor including a lower electrode, a dielectric layer, and an upper electrode. In certain embodiments, the data storage element DS may include a magnetic tunnel junction (MTJ) pattern. In certain embodiments, the data storage element DS may include a phase change material or a variable resistance material.

Peripheral transistors PT may be provided in the peripheral circuit region PCR (see FIG. 3B). In some embodiments, each of the peripheral transistors PT may include a peripheral gate electrode PG, a peripheral gate insulating layer PI, and source/drain regions 103. In some embodiments, the peripheral transistors PT may be a portion of the word line driver.

A peripheral contact plug PC may be provided to be connected to an upper portion of the substrate 100 of the peripheral circuit region PCR. The peripheral contact plug PC may be connected to the peripheral transistor PT, e.g., the source/drain region 103. For example, the peripheral contact plug PC may be provided in a second contact hole H2 penetrating first to third interlayer insulating layers 191, 192, and 193 along the third direction D3. The peripheral contact plug PC may include a barrier layer 155 and a metal layer 154. For example, the barrier layer 155 may include a conductive metal nitride, e.g., such as titanium nitride, tantalum nitride, or tungsten nitride. For example, the metal layer 154 may include at least one of titanium, tungsten, or tantalum.

The peripheral contact plug PC may be connected to a first peripheral interconnection line PL through a second upper contact 198. In some embodiments, the second upper contact 198 may penetrate fourth and fifth interlayer insulating layers 194 and 195 to electrically connect the peripheral contact plug PC to the first peripheral interconnection line PL.

As may be seen in FIG. 3A, word line contact plugs LC extending along the third direction D3 may be provided to be connected to end portions of the word lines WL. The word line contact plugs LC may be provided in the peripheral circuit region PCR. The end portion of each of the word lines WL may include a contact surface CS exposed in an extending direction of the word line WL. i.e., the first direction D1, that extend along the third direction D3. The word line WL and the word line contact plug LC may be connected to each other through the contact surface CS. In some embodiments, each of the word lines WL may include a pair of sidewalls substantially parallel, and the contact surface CS may connect the pair of sidewalls.

As illustrated in FIG. 4, the contact surface CS may include a first contact surface S1 which is a portion of a sidewall of the lower pattern BE (i.e., the metal pattern), and a second contact surface S2 which is a portion of a sidewall of the upper pattern UE (i.e., the semiconductor pattern). In other words, the word line contact plugs LC may be connected to the sidewalls of the word lines WL. An area of the first contact surface S1 may be greater than an area of the second contact surface S2.

The word line contact plug LC may include a stepped portion ST adjacent to a boundary between the first contact surface S1 and the second contact surface S2. For example, the contact surface CS may include a stepped surface, and the stepped portion ST may be in contact with the stepped surface. For example, the stepped surface may be a portion of the first contact surface S1. A width of the word line contact plug LC along the first direction D1 may decrease discontinuously at the stepped portion ST. The word line contact plug LC may extend, along the third direction D3, an entirety of the second contact portion S2 and a portion of the first contact portion S1. In other words a lower surface of the word line contact plug LC may be higher than a lower surface of the word line WL.

A portion of each of the word line contact plugs LC may overlap each of the word lines WL. For example, a lower portion of the word line contact plug LC may include a first portion R1 overlapping the word line WL along the first direction D1 and a second portion R2 overlapping with the device isolation layer 102 along the first direction D1. In other words, the second portion R2 may not overlap the word line WL along the first direction D1. The first portion R1 may extend along the third direction D3 to be in contact with the contact surface CS. The second portion R2 may extend along the third direction D3 to be in contact with the device isolation layer 102. The first portion R1 may be wider along the first direction D1 than the second portion R2.

Each of the word line contact plugs LC may have a long axis LX in the first direction D1 when viewed in a plan view (see FIG. 2). For example, the word line contact plug LC may have a bar shape which is longer in the first direction D1 than in the second direction D2 in a plan view. Alternatively, the word line contact plug LC may have an elliptical shape which is longer in the first direction D1 than in the second direction D2 in a plan view. A ratio of a short axis SX to the long axis LX of the word line contact plug LC may range from about 1:2 to about 1:7.

Each of the word line contact plugs LC may include a barrier layer 151 and a metal layer 152. For example, the barrier layer 151 may include a conductive metal nitride such as titanium nitride, tantalum nitride, or tungsten nitride. For example, the metal layer 152 may include at least one of titanium, tungsten, or tantalum.

Top surfaces TS1 (FIG. 3A) of the word line contact plugs LC may be at substantially the same level as a top surface TS2 (FIG. 3B) of the peripheral contact plug PC along the third direction D3. Top surfaces TS3 (FIG. 3C) of the connection pads 169 may be at substantially the same level as the top surfaces TS1 of the word line contact plugs LC and the top surface TS2 of the peripheral contact plug PC along the third direction D3.

The word line contact plugs LC may be connected to second peripheral interconnection lines ML through third upper contacts 196. In some embodiments, the third upper contact 196 may penetrate the fourth and fifth interlayer insulating layers 194 and 195 to electrically connect the word line contact plug LC to the second peripheral interconnection line ML.

Figure 5:
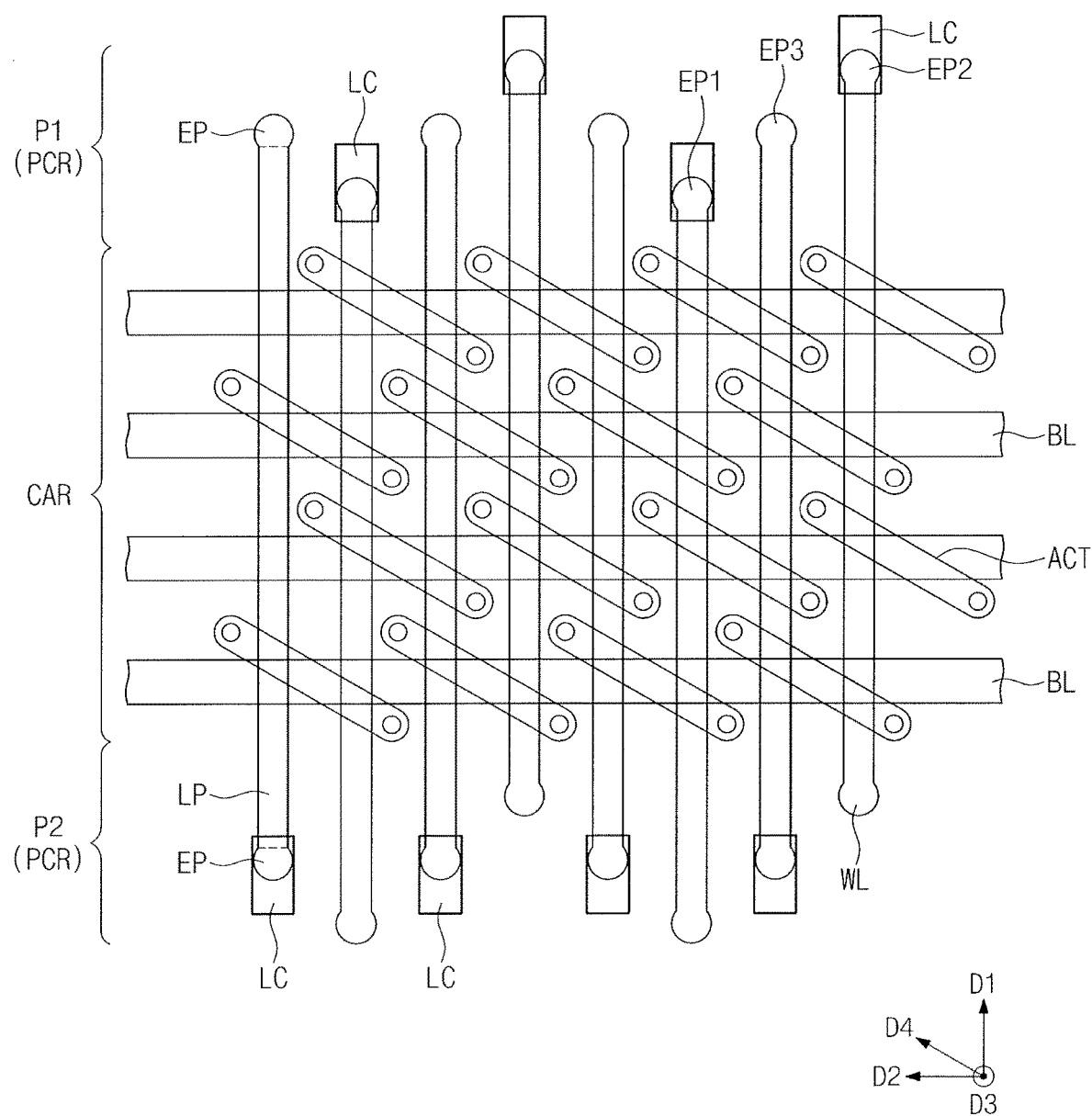
FIGS. 5 to 7 illustrate plan views semiconductor memory devices according to some embodiments.
Figure 6:
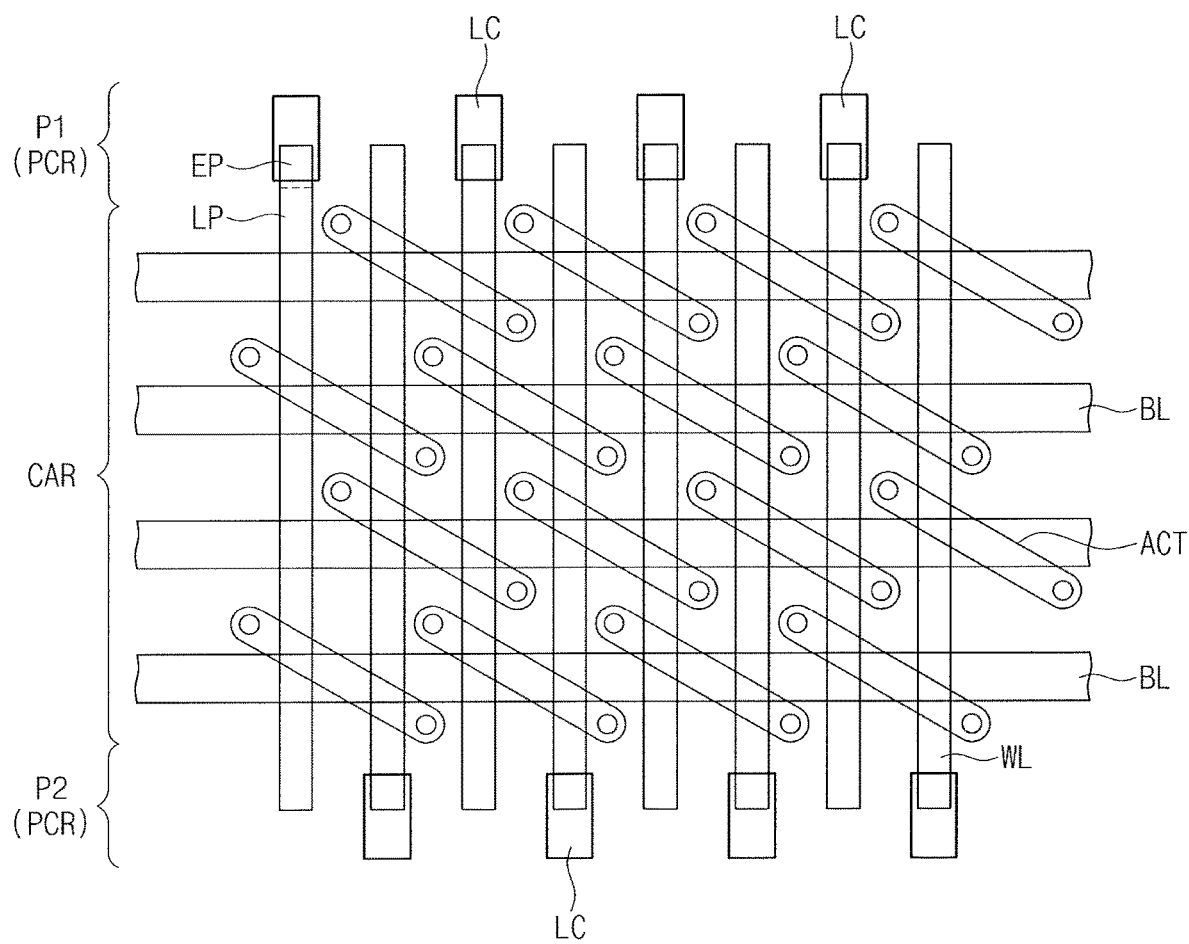
Figure 7:
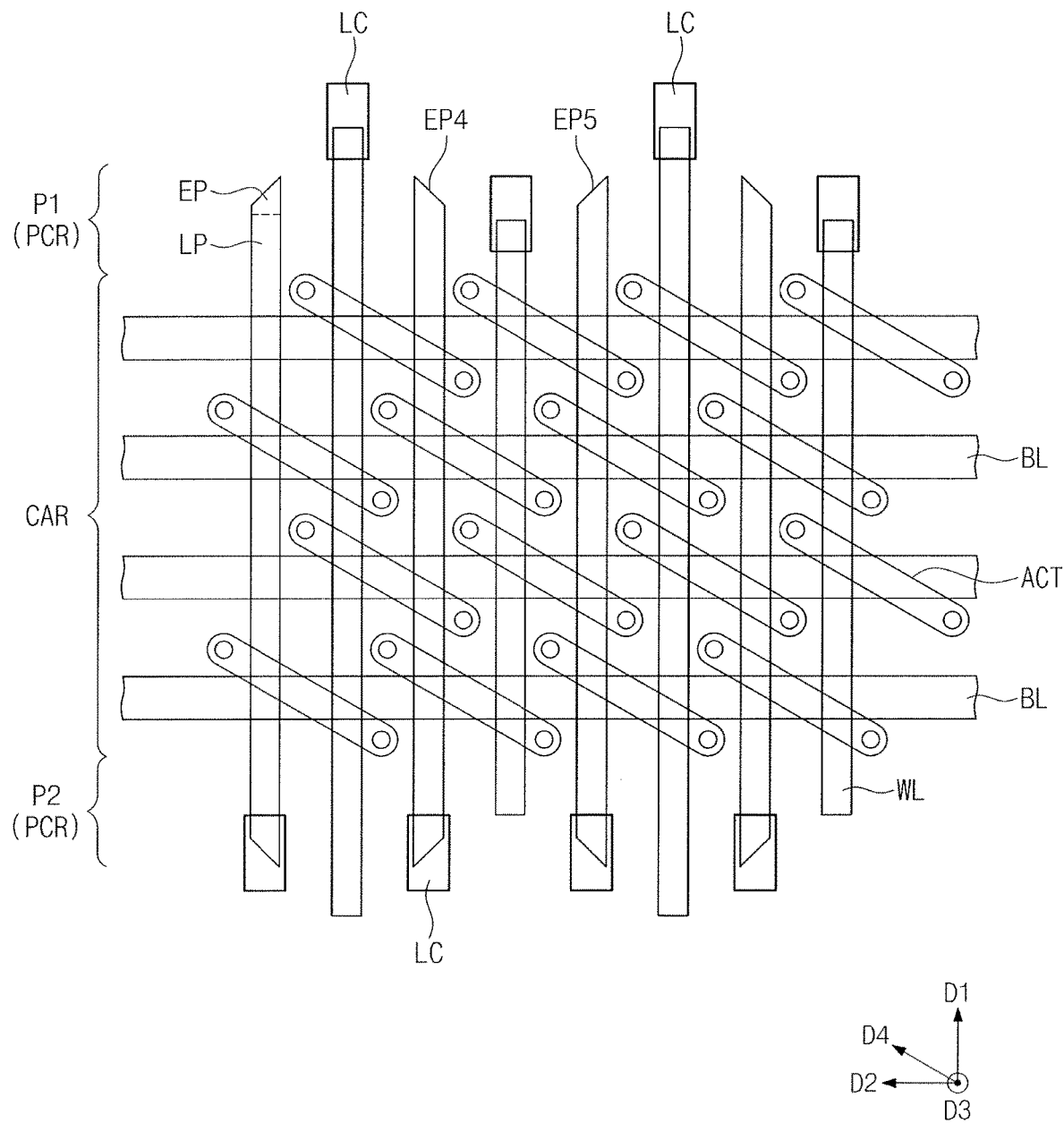

FIGS. 5 to 7 are plan views illustrating semiconductor memory devices according to some embodiments. Hereinafter, the descriptions to the same elements or components as in the above embodiments will be omitted for the purpose of ease and convenience in explanation.

Referring to FIG. 5, a semiconductor memory device according to some embodiments may include the cell array region CAR and a peripheral circuit region PCR. The peripheral circuit region PCR may include the first peripheral circuit region P1 and the second peripheral circuit region P2, with the cell array region CAR interposed therebetween. End portions of each of word lines WL may be in the first peripheral circuit region P1 and the second peripheral circuit region P2, respectively.

Each of the word lines WL may be connected to a word line contact plug LC in the first peripheral circuit region P1 or the second peripheral circuit region P2. For example, odd-numbered word lines WL may be connected to the word line contact plugs LC in the second peripheral circuit region P2, and even-numbered word lines WL may be connected to the word line contact plugs LC in the first peripheral circuit region P1.

According to some embodiments, each of the word lines WL may include a line portion LP and end portions EP disposed at both ends of the line portion LP, respectively. The word line contact plugs LC may be connected to the end portions EP. A width of the end portion EP in a second direction D2 may be greater than a width of the line portion LP in the second direction D2. A planar shape of the end portion EP is a circular shape in FIG. 5. In certain embodiments, the planar shape of the end portion EP may be one of other various shapes, e.g., an elliptical shape, a rectangular shape, and the like, having at least a portion thereof wider along the second direction than the line portions LP.

The end portions EP of the word lines WL may be arranged in a zigzag form along the second direction D2. For example, the end portions EP in the first peripheral circuit region P1 may be arranged in a zigzag form along the second direction D2. For example, first end portions EP1 and second end portions EP2, shifted or offset from the first end portions EP1 in the first direction D1, may be alternately arranged in the second direction D2. In some embodiments, third end portions EP3 the may be provided between the first end portion EP1 and the second end portion EP2. Each of the third end portions EP3 may be between the first end portion EP1 and the second end portion EP2 adjacent to each other. For example, each of the third end portions EP3 shifted or offset from the first end portions EP1 along the first direction by a lesser amount than the second end portions EP2, e.g., may be half of the offset of the second end portions EP2. As a result, the end portions EP of the word lines WL may be arranged in a wave form along the second direction D2.

The word line contact plugs LC connected to the end portions EP may also be arranged in a zigzag form along the second direction D2. For example, the word line contact plugs LC in the first peripheral circuit region P1 may be arranged in a zigzag form along the second direction D2. As illustrated in FIG. 5, the word line contact plugs LC in the second peripheral circuit region P2 may be arranged in a line along the second direction D2, e.g., not offset or shifted along the first direction D1, since end portions EP of odd-numbered word lines WL are not offset relative to one another along the first direction D1. Alternatively, the word line contact plugs LC in the second peripheral circuit region P2 may be arranged in a zigzag form, like the word line contact plugs LC disposed in the first peripheral circuit region P1.

Referring to FIG. 6, a width of a line portion LP in the second direction D2 may be substantially equal to widths of end portions EP in the second direction D2 in a semiconductor memory device according to some embodiments, unlike FIG. 5. The end portions EP in a first peripheral circuit region P1 may be arranged in a line along the second direction D2, e.g., with no offset or shift along the first direction D1. The word line contact plugs LC in the first peripheral circuit region P1 may also be arranged in a line along the second direction D2, e.g., with no offset or shift along the first direction D1. The end portions EP in a second peripheral circuit region P2 may be arranged in a line along the second direction D2. The word line contact plugs LC in the second peripheral circuit region P2 may also be arranged in a line along the second direction D2.

Referring to FIG. 7, in a semiconductor memory device according to some embodiments, shapes of end portions EP of one or some word lines WL may be different from those of end portions EP of another or other word lines WL. For example, one surface of each of end portions EP of odd-numbered word lines WL may have a slanted shape, e.g., at an angle to the second direction D2, when viewed in a plan view, while surface of each of end portions EP of even-numbered word lines WL may be substantially parallel to the second direction D2. For example, an end portion EP4 may have slanted shape that are mirror images along the second direction and an end portion EP5 may be a mirror image of the end portion EP4 along the first direction. Adjacent end portions EP may be offset from one another in a similar fashion to those in FIG. 5. The word line contact plugs LC in the first peripheral circuit region P1 may be arranged in a zigzag form along the second direction D2, while the word line contact plugs LC in the second peripheral circuit region P2 may be arranged in a line.

Figure 8A:
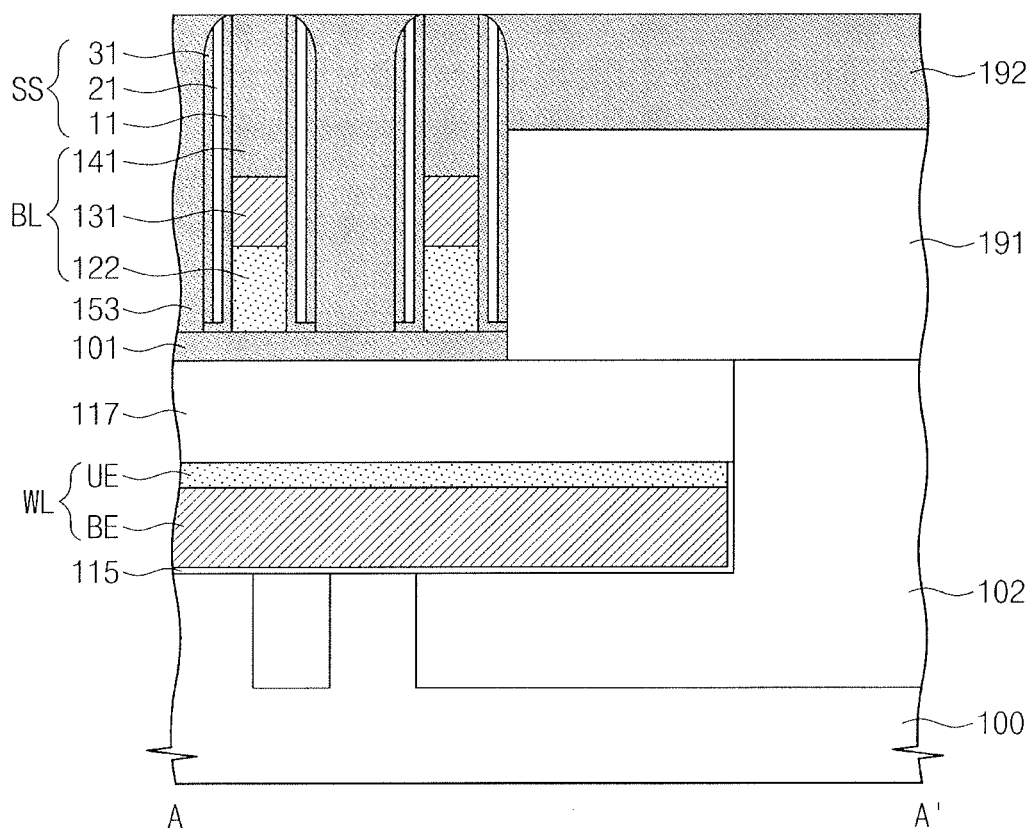
FIGS. 8A and 9A illustrate cross-sectional views taken along the line A-A' of FIG. 2 of stages in a method of manufacturing a semiconductor memory device, according to some embodiments.
Figure 8B:
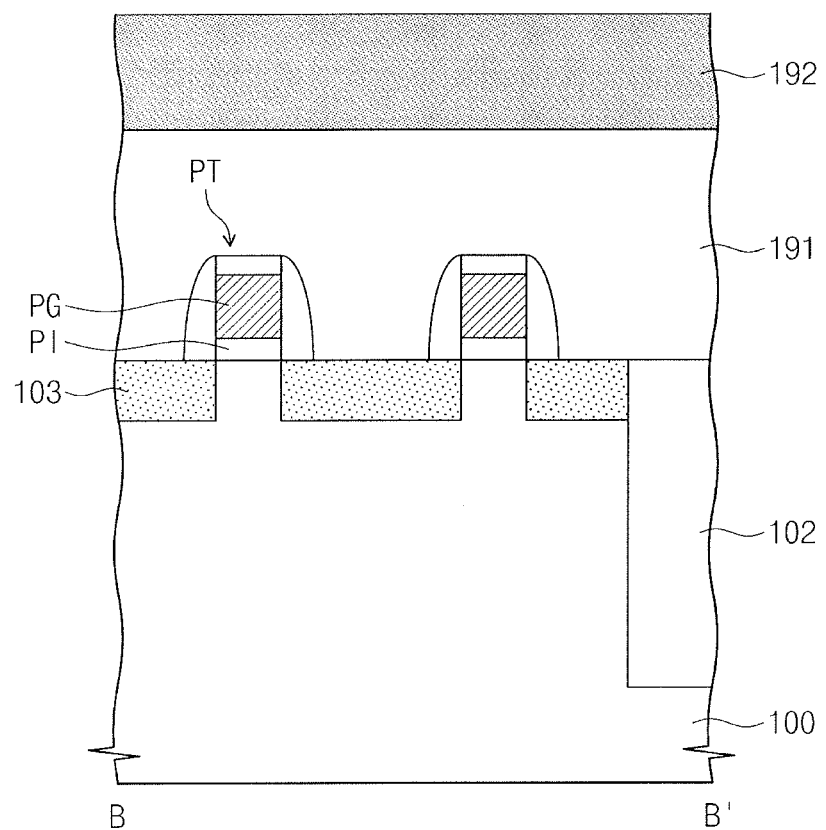
FIGS. 8B and 9B illustrate cross-sectional views taken along the line B-B' of FIG. 2.
Figure 8C:
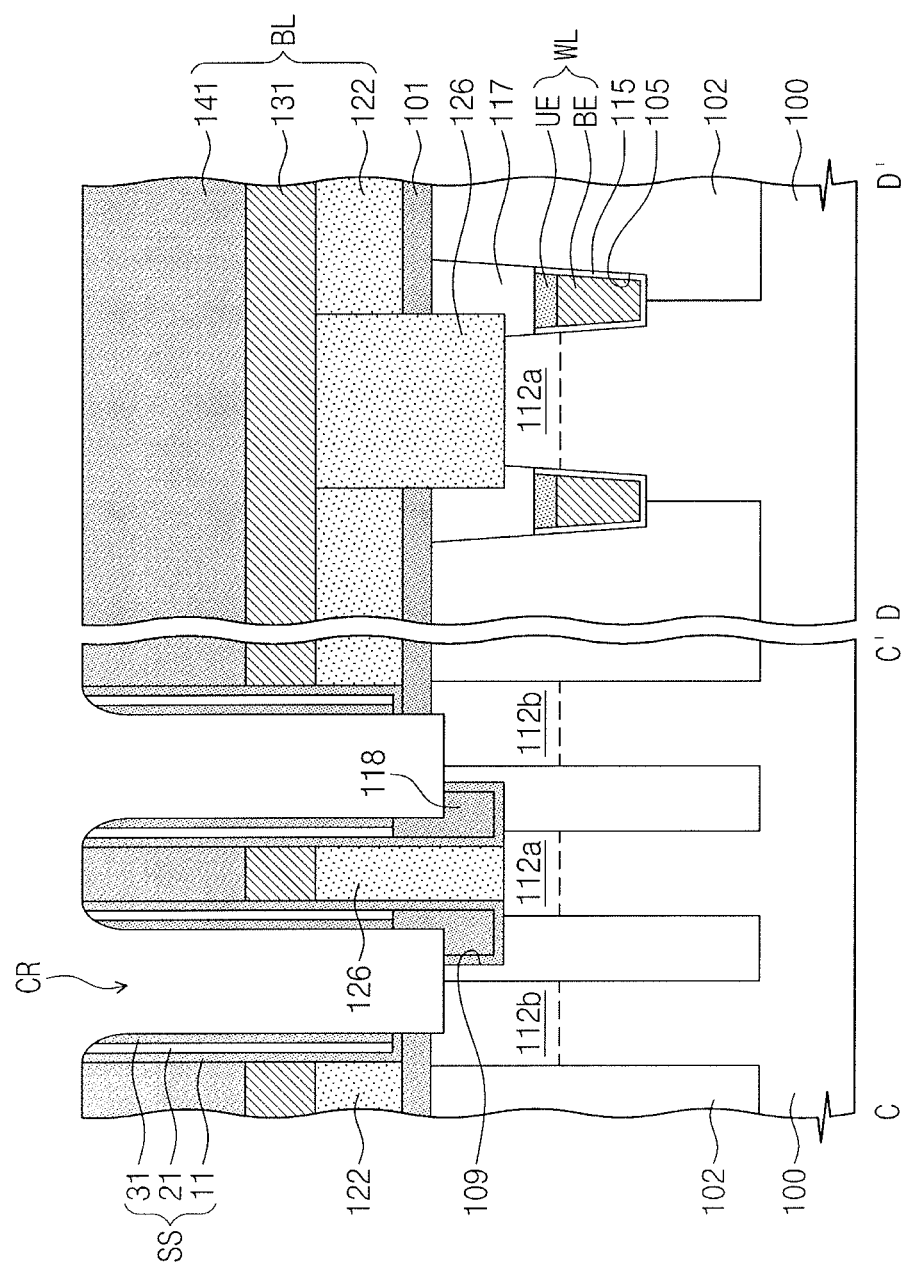
FIGS. 8C and 9C illustrate cross-sectional views taken along the lines C-C' and D-D' of FIG. 2.
Figure 9A:
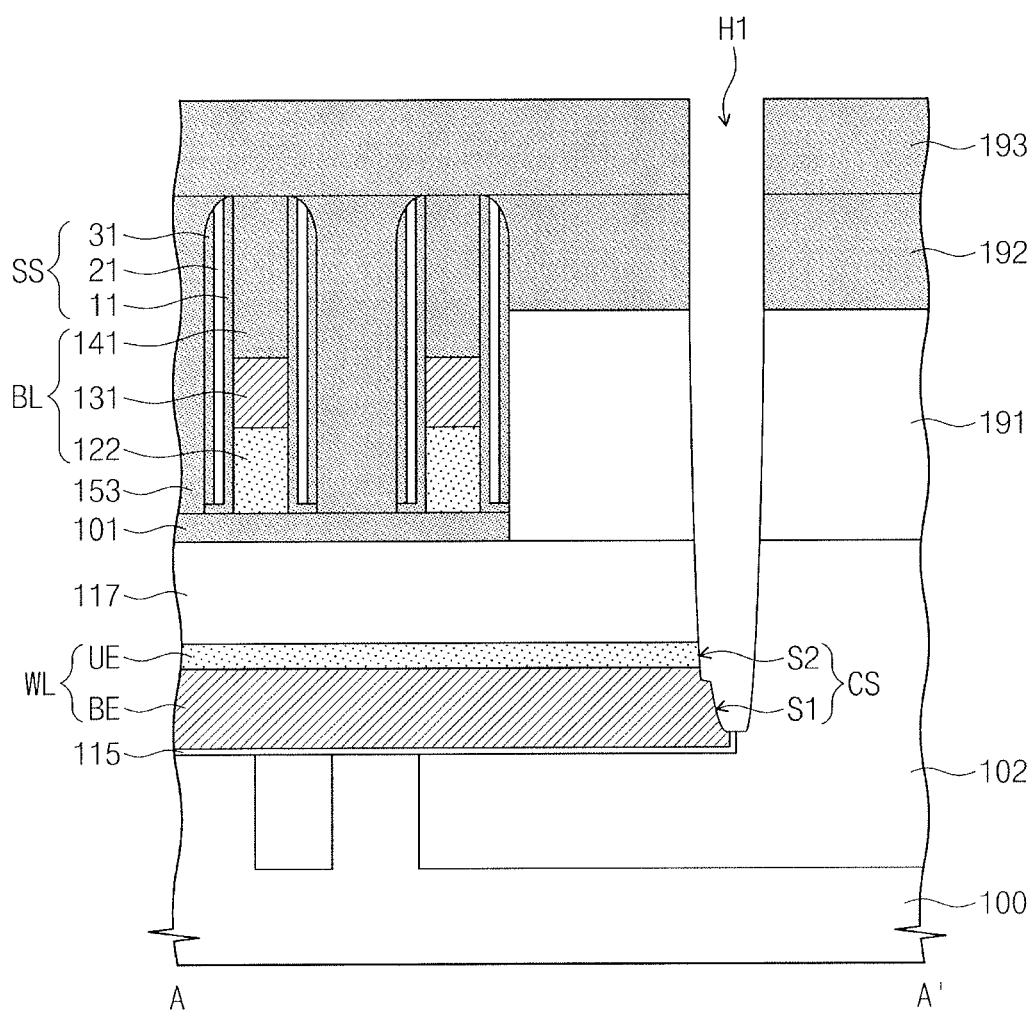
Figure 9B:
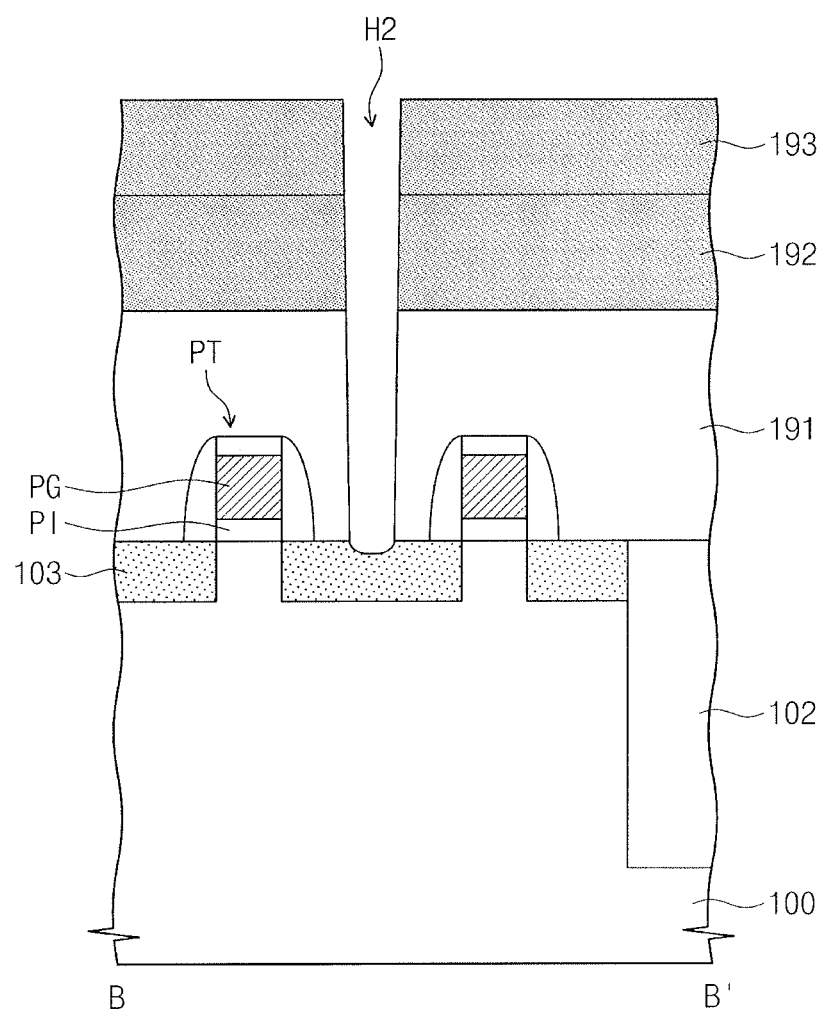
Figure 9C:
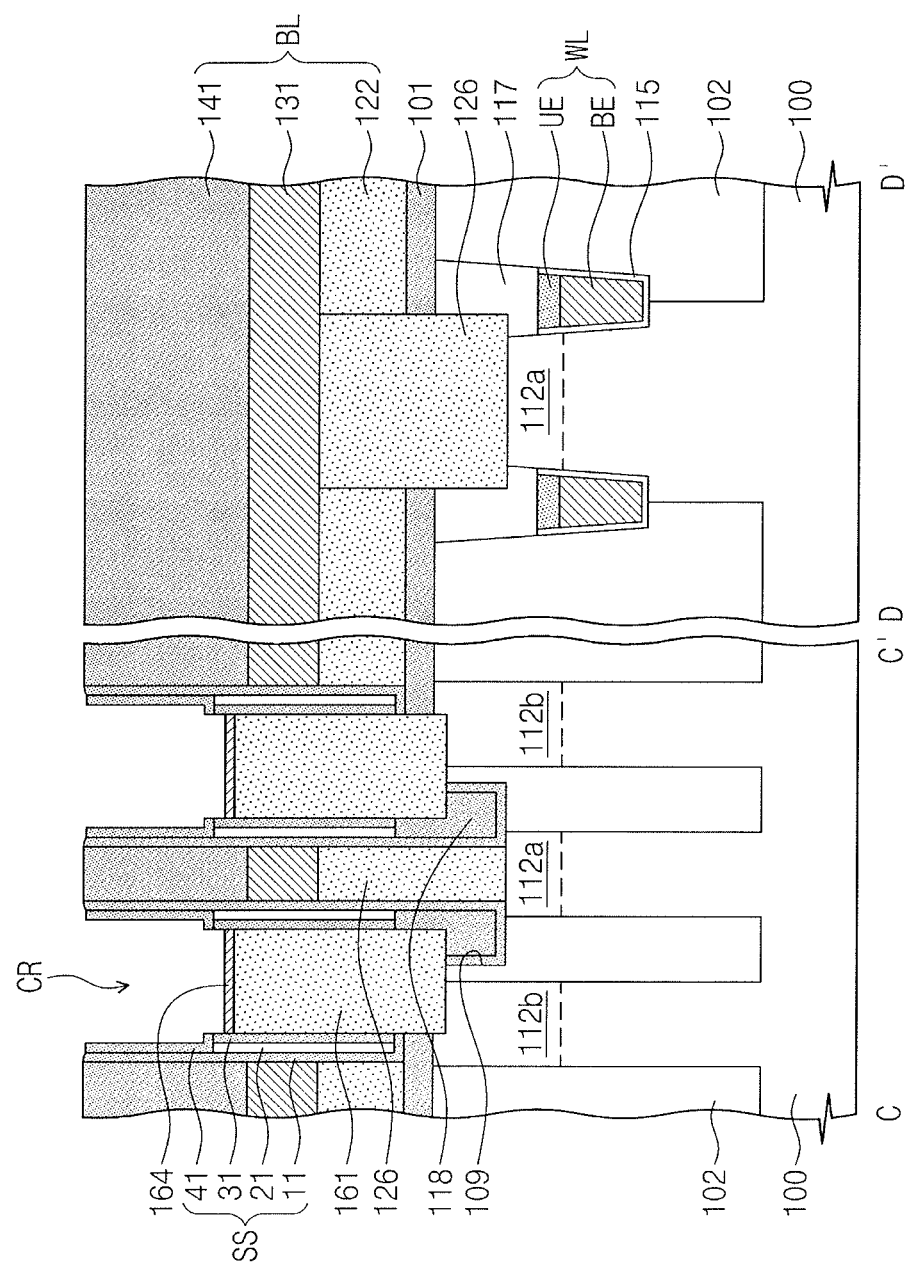

FIGS. 8A and 9A are cross-sectional views taken along the line A-A' of FIG. 2 to illustrate stage in a method of manufacturing a semiconductor memory device, according to some embodiments. FIGS. 8B and 9B are cross-sectional views taken along the line B-B' of FIG. 2. FIGS. 8C and 9C are cross-sectional views taken along the lines C-C' and D-D' of FIG. 2.

Referring to FIGS. 2 and 8A to 8C, a device isolation layer 102 may be formed in a substrate 100 to define active portions ACT in a cell array region CAR. A device isolation trench may be formed in the substrate 100, and the device isolation layer 102 may fill the device isolation trench. Each of the active portions ACT may have a bar shape extending in the fourth direction D4 when viewed in a plan view. An ion implantation process may be performed using the device isolation layer 102 as an ion implantation mask to form dopant regions in upper portions of the active portions ACT. The active portions ACT and the device isolation layer 102 may be patterned to form recess regions 105. A pair of the recess regions 105 may intersect each of the active portions ACT. The dopant regions may be divided into first dopant regions 112*a* and second dopant regions 112*b* by the recess regions 105.

A gate dielectric layer 115 may be formed on inner surfaces of the recess regions 105. The gate dielectric layer 115 may be formed by a thermal oxidation process, a chemical vapor deposition (CVD) process, and/or an atomic layer deposition (ALD) process. Subsequently, a gate conductive layer may be formed to fill the recess regions 105, and the gate conductive layer may be etched to form word lines WL in the recess regions 105, respectively. In some embodiments, the gate conductive layer may include a metal layer and a semiconductor layer on the metal layer. Thus, each of the word lines WL may include the lower pattern BE and the upper pattern UE, which are sequentially stacked along the third direction D3.

Top surfaces of the word lines WL may be recessed to be lower than top surfaces of the active portions ACT along the third direction D3. An insulating layer may be formed on the substrate 100 to fill the recess regions 105, and an etching process may be performed on the insulating layer to form word line capping patterns 117 on the word lines WL, respectively.

An insulating layer and a conductive layer may be sequentially formed on an entire surface of the substrate 100 and then may be patterned to form a lower insulating pattern 101 and a first conductive pattern 122, which are sequentially stacked along the third direction. For example, the lower insulating pattern 101 may be formed of at least one of silicon oxide, silicon nitride, or silicon oxynitride. In some embodiments, the lower insulating pattern 101 may be formed to include segments spaced apart from each other. The first conductive pattern 122 may have a planar shape corresponding to a planar shape of the lower insulating pattern 101. The lower insulating pattern 101 may be formed to cover end portions of two adjacent active portions ACT (i.e., the second dopant regions 112*b* adjacent to each other) at the same time. Upper portions of the device isolation layer 102, the substrate 100 and the word line capping patterns 117 may be etched using the lower insulating pattern 101 and the first conductive pattern 122 as etch masks to form an opening 109. The opening 109 may expose the first dopant regions 112*a*.

A preliminary contact pattern may be formed to fill the opening 109. A conductive layer may be formed on the substrate 100, and a planarization process may be performed on the conductive layer to form the preliminary contact pattern. For example, the preliminary contact pattern may be formed of doped poly-silicon. A second conductive layer may be formed on the first conductive pattern 122, and mask patterns 141 may be formed on the second conductive layer. The second conductive layer and the first conductive pattern 122 may be etched using the mask patterns 141 as etch masks. For example, the etching process may include an anisotropic etching process. As a result, bit line structures BL, each of which includes the first conductive pattern 122, the second conductive pattern 131, and the mask pattern 141, may be formed. At this time, the preliminary contact pattern may also be etched to form first contact plugs 126.

The first spacer 11 may be formed on sidewalls of the bit line structures BL. For example, the first spacer 11 may be formed using a CVD process or an ALD process. The first spacer 11 may extend along a sidewall and a bottom surface of the opening 109. For example, the first spacer 11 may be formed of silicon nitride or silicon oxynitride.

The gap-fill insulating layer 118 may be provided to fill the opening 109. An insulating layer may be formed to fill the opening 109, and an etch-back process may be performed on the insulating layer to form the gap-fill insulating layer 118. For example, the gap-fill insulating layer 118 may include at least one of silicon oxide, silicon nitride, or silicon oxynitride.

The second spacer 21 and the third spacer 31 may be sequentially formed on a sidewall of the first spacer 11. For example, the second spacer 21 may be formed of silicon oxide. The third spacer 31 may be formed of the same material as the first spacer 11. For example, the third spacer 31 may be formed of silicon nitride or silicon oxynitride.

Fence insulating patterns 153 may be formed between the bit line structures BL. For example, the fence insulating patterns 153 may include silicon nitride or silicon oxynitride. Contact regions CR exposing the second dopant regions 112*b* may be formed by an anisotropic etching process using the fence insulating patterns 153 and the mask patterns 141 as etch masks. Portions of the lower insulating pattern 101 and portions of the first and third spacers 11 and 31 may also be removed by the anisotropic etching process.

Peripheral transistors PT may be formed on the substrate 100 of the peripheral circuit region PCR. Each of the peripheral transistors PT may include a peripheral gate electrode PG, a peripheral gate insulating layer PI, and source/drain regions 103. The peripheral gate electrode PG may be formed together with the bit line structure BL. The first interlayer insulating layer 191 and the second interlayer insulating layer 192 may be formed to sequentially cover the peripheral transistors PT. For example, each of the first and second interlayer insulating layers 191 and 192 may include at least one of silicon oxide, silicon oxynitride, or silicon nitride.

Referring to FIGS. 2 and 9A to 9C, second contact plugs 161 may be formed in lower regions of the contact regions CR. The second contact plugs 161 may be formed of a doped semiconductor material such as doped poly-silicon. For example, a poly-silicon layer may be formed to fill the contact regions CR, and an etch-back process may be performed on the poly-silicon layer to form the second contact plugs 161. Top surfaces of the second contact plugs 161 may be higher than top surfaces of the second conductive patterns 131.

Upper portions of the second and third spacers 21 and 31 exposed by the second contact plugs 161 may be etched. Thereafter, a fourth spacer 41 may be formed on an exposed sidewall of the first spacer 11. For example, the fourth spacer 41 may be formed of silicon nitride or silicon oxynitride. In some embodiments, the fourth spacer 41 may be formed of the same material as the first and third spacers 11 and 31. The process of forming the fourth spacer 41 may include an etching process such as an etch-back process, and upper portions of the second contact plugs 161 may also be etched during the etching process.

Ohmic layers 164 may be formed on the second contact plugs 161. The formation of the ohmic layers 164 may include a deposition process of a metal layer and a thermal treatment process. The ohmic layers 164 may include a metal silicide. e.g., tungsten silicide, titanium silicide, or tantalum silicide.

The third interlayer insulating layer 193 may be formed to cover the peripheral circuit region PCR. First contact holes H1 may be formed to penetrate the first to third interlayer insulating layers 191, 192 and 193. The first contact holes H1 may expose end portions of the word lines WL, respectively. Lower regions of the first contact holes H1 may expose contact surfaces CS of the word lines WL, respectively. The contact surface CS may include a first contact surface S1 which is a portion of a sidewall of the lower pattern BE, and a second contact surface S2 which is a portion of a sidewall of the upper pattern UE.

A second contact hole H2 may be formed to penetrate the first to third interlayer insulating layers 191, 192, and 193. The second contact hole H1 may expose the substrate 100 of the peripheral circuit region PCR. For example, the second contact hole H2 may expose the source/drain region 103 of the peripheral transistor PT. The first contact holes H1 may be formed simultaneously with the second contact hole H2. In other words, the first and second contact holes H1 and H2 may be formed by the same etching process. During the formation of the first and second contact holes H1 and H2, the cell array region CAR may be covered by the third interlayer insulating layer 193. At least a portion of the third interlayer insulating layer 193 may be removed from the cell array region CAR after the formation of the first and second contact holes H1 and H2.

Since the word lines WL are buried in the upper portion of the substrate 100, the first contact holes H1 may be deeper than the second contact hole H2. Thus, the substrate 100 under the second contact hole H2 may be excessively etched when the second contact hole H2 is formed. To prevent this phenomenon, the process of forming the first and second contact holes H1 and H2 may be performed using an etching process in which an etch rate of the substrate material, e.g., a semiconductor material (e.g., silicon) is relatively low. Thus, it is possible to solve a problem that the substrate 100 under the second contact hole H2 is excessively etched (e.g., the second contact hole H2 penetrates the source/drain region 103). However, in this case, the first contact holes H1 may incompletely penetrate the upper patterns UE including the semiconductor material. Thus, word line contact plugs formed in the first contact holes H1 may be incompletely connected to the lower patterns BE to cause an increase in electrical resistance and/or disconnection.

However, according to the embodiments, the first contact holes H1 may be formed to overlap with the end portions of the word lines WL. When an etch rate of the device isolation layer 102 is higher than an etch rate of the upper patterns UE in the etching process for forming the first and second contact holes H1 and H2, sidewalls of the lower patterns BE may be easily exposed. In other words, the first contact holes H1 exposing the lower patterns BE may be formed while minimizing influence on the etch rate of the upper patterns UE. As a result, electrical characteristics of the semiconductor memory device may be improved, and reliability of the semiconductor memory device may also be improved.

Referring again to FIGS. 2 and 3A to 3C, word line contact plugs LC may be formed in the first contact holes H1. A peripheral contact plug PC may be formed in the second contact hole H2. The word line contact plugs LC and the peripheral contact plug PC may be formed at the same time. Connection pads 169 may be formed in the contact regions CR. The connection pads 169 may be formed simultaneously with the word line contact plugs LC and the peripheral contact plug PC. As a result, top surfaces TS3 of the connection pads 169, top surfaces TS1 of the word line contact plugs LC and a top surface TS2 of the peripheral contact plug PC may be disposed at substantially the same level.

For example, a barrier layer and a metal layer may be sequentially formed in the first and second contact holes H1 and H2 and the contact regions CR, and then, a planarization process may be performed on the metal layer and the barrier layer. As a result, the word line contact plugs LC, the peripheral contact plug PC and the connection pads 169, each of which includes the barrier layer and the metal layer, may be formed.

The formation of the connection pads 169 may include performing a patterning process on a barrier layer 167 and a metal layer 168 to form an isolation region 183 penetrating the barrier layer 167 and the metal layer 168. An isolation insulating layer 185 may be formed in the isolation region 183. The connection pads 169 may be spaced apart from each other by the isolation insulating layer 185. The isolation insulating layer 185 may be formed of at least one of silicon oxide, silicon nitride, or silicon oxynitride.

The fourth interlayer insulating layer 194 may be formed on the connection pads 169. First upper contacts 197 may be formed in the fourth interlayer insulating layer 194. Data storage elements DS may be formed on the first upper contacts 197. For example, each of the data storage elements DS may be a capacitor including a lower electrode, a dielectric layer, and an upper electrode. The fifth interlayer insulating layer 195 may be formed to cover the data storage elements DS, and then, second and third upper contacts 198 and 196 may be formed to penetrate the fourth and fifth interlayer insulating layers 194 and 195. Each of the fourth and fifth interlayer insulating layers 194 and 195 may be formed of silicon oxide or silicon oxynitride. The first to third upper contacts 197, 198 and 196 may include a metal material such as tungsten. A first peripheral interconnection line PL connected to the second upper contact 198 may be formed, and second peripheral interconnection lines ML connected to the third upper contacts 196 may be formed. The first and second peripheral interconnection lines PL and ML may be formed on the fifth interlayer insulating layer 195. For example, the first and second peripheral interconnection lines PL and ML may be formed at the same time.

According to the embodiments, the electrical connection between the word line contact plugs and the lower patterns may be improved. Thus, the electrical characteristics and reliability of the semiconductor memory device may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A semiconductor memory device, comprising:
   a word line buried in an upper portion of a substrate and extending in a first direction;
   a word line contact plug connected to the word line; and
   a device isolation layer in the substrate to define active portions, wherein an end portion of the word line includes a contact surface exposed in the first direction and extending along a second direction, intersecting the first direction, wherein the word line contact plug is connected to the contact surface, and wherein the word line contact plug includes
  a first portion overlapping the end portion of the word line; and
  a second portion overlapping with the device isolation layer.

2. The semiconductor memory device as claimed in claim 1, wherein:
  the word line includes:
    a metal pattern; and
    a semiconductor pattern on the metal pattern; and
  the contact surface includes:
    a first contact surface which is a portion of a sidewall of the metal pattern; and
    a second contact surface which is a portion of a sidewall of the semiconductor pattern.

3. The semiconductor memory device as claimed in claim 2, wherein the word line contact plug includes a stepped portion adjacent to a boundary between the first contact surface and the second contact surface.

4. The semiconductor memory device as claimed in claim 3, wherein the stepped portion is in contact with the first contact surface.

5. The semiconductor memory device as claimed in claim 2, wherein a surface area of the first contact surface is greater than a surface area of the second contact surface.

6. The semiconductor memory device as claimed in claim 1, wherein the word line contact plug is longer in the first direction than a third direction, intersecting the first and second direction, when viewed in a plan view.

7. The semiconductor memory device as claimed in claim 6, wherein;
  the word line contact plug has a short axis along the third direction and a long axis along the first direction when viewed in a plan view, and
  a ratio of the short axis to the long axis ranges from about 1:2 to about 1:7.

8. The semiconductor memory device as claimed in claim 1, further comprising:
  active portions defined in the substrate by a device isolation layer;
  data storage elements on the active portions; and
  connection pads between the active portions and the data storage elements,
  wherein a top surface of the word line contact plug is at substantially the same level as top surfaces of the connection pads in the second direction.

9. The semiconductor memory device as claimed in claim 8, further comprising:
  bit line structures intersecting the word line,
  wherein a lower portion of each of the connection pads is provided between the bit line structures, and
  wherein an upper portion of each of the connection pads extends onto the bit line structure.

10. The semiconductor memory device as claimed in claim 1, further comprising:
  a peripheral contact plug connected to an upper portion of the substrate of a peripheral circuit region,
  wherein a top surface of the word line contact plug is at substantially the same level as a top surface of the peripheral contact plug in the second direction.

11. A semiconductor memory device, comprising:
  a substrate including a cell array region and a peripheral circuit region;
  word lines buried in an upper portion of the substrate and extending from the cell array region to the peripheral circuit region in a first direction; and
  word line contact plugs connected to end portions of the word lines,
  wherein each of the word line contact plugs has a long axis in the first direction when viewed in a plan view, and a portion of each of the word line contact plugs overlaps the end portion of the word line.

12. The semiconductor memory device as claimed in claim 11, further comprising:
  a device isolation layer in the substrate to define active portions,
  wherein each of the word line contact plugs includes:
    a first portion overlapping with the end portion of the word line; and
    a second portion overlapping with the device isolation layer.

13. The semiconductor memory device as claimed in claim 11, wherein:
  the end portions of the word lines include contact surfaces exposed in the first direction, and
  the word line contact plugs are in contact with the contact surfaces.

14. The semiconductor memory device as claimed in claim 13, wherein:
  each of the word lines includes:
    a metal pattern; and
    a semiconductor pattern on the metal pattern, and
  each of the contact surfaces includes:
    a first contact surface which is a portion of a sidewall of the metal pattern; and
    a second contact surface which is a portion of a sidewall of the semiconductor pattern.

15. The semiconductor memory device as claimed in claim 11, wherein the end portions of the word lines are arranged in a zigzag form along a second direction intersecting the first direction.

16. The semiconductor memory device as claimed in claim 11, wherein:
  the word lines include line portions extending from the end portions to the cell array region, and
  widths of the end portions in a second direction intersecting the first direction are greater than widths of the line portions in the second direction.

17. The semiconductor memory device as claimed in claim 11, wherein each of the word line contact plugs includes a stepped portion at a lower portion thereof.

18. A semiconductor memory device, comprising:
  a substrate including a cell array region and a peripheral circuit region;
  a word line buried in an upper portion of the substrate and extending from the cell array region to the peripheral circuit region in a first direction;
  a word line contact plug connected to an end portion of the word line; and
  a peripheral contact plug connected to an upper portion of the substrate of the peripheral circuit region,
  wherein a top surface of the word line contact plug is at substantially the same level as a top surface of the peripheral contact plug.

19. The semiconductor memory device as claimed in claim 18, wherein:
   the word line includes:
      a metal pattern; and
      a semiconductor pattern on the metal pattern, and
   a lower portion of the word line contact plug extends along a sidewall of the metal pattern.

\* \* \* \* \*